US008273524B2

(12) United States Patent
Horiuchi et al.

(10) Patent No.: US 8,273,524 B2
(45) Date of Patent: Sep. 25, 2012

(54) LIQUID DISCHARGING HEAD, PRODUCING METHOD THEREOF, STRUCTURE, AND PRODUCING METHOD THEREOF

(75) Inventors: Isamu Horiuchi, Kawasaki (JP); Kazunari Ishizuka, Suntou-gun (JP)

(73) Assignee: Canon Kabushiki Kaisha, Tokyo (JP)

( * ) Notice: Subject to any disclaimer, the term of this patent is extended or adjusted under 35 U.S.C. 154(b) by 1154 days.

(21) Appl. No.: 12/129,132

(22) Filed: May 29, 2008

(65) Prior Publication Data

US 2008/0309733 A1 Dec. 18, 2008

(30) Foreign Application Priority Data

Jun. 18, 2007 (JP) ................................ 2007-160194
Jun. 20, 2007 (JP) ................................ 2007-162487

(51) Int. Cl.
*G03F 7/20* (2006.01)

(52) U.S. Cl. ........................................ 430/319

(58) Field of Classification Search .................. 430/319, 430/311
See application file for complete search history.

(56) References Cited

U.S. PATENT DOCUMENTS

| | | | |
|---|---|---|---|
| 5,478,606 | A | 12/1995 | Ohkuma et al. |
| 2007/0252872 | A1 | 11/2007 | Fujii et al. |

*Primary Examiner* — Brittany Raymond

(74) *Attorney, Agent, or Firm* — Fitzpatrick, Cella, Harper & Scinto

(57) ABSTRACT

A producing method of a liquid discharging head includes a discharge port discharging a liquid and a flow path communicating with the discharge port, the method comprising the steps of forming a pattern of a shape of the flow path on a substrate, forming a layer of a negative type photosensitive resin composition including a photo-initiated polymerization initiator on the substrate so as to coat the pattern, at least a region of the layer in a vicinity of the substrate including a sensitizing agent of the photo-initiated polymerization initiator, a density of the sensitizing agent in the layer formed to be higher in the region than in a part where the discharge port is formed, forming the discharge port by exposing the layer to pattern the layer, and removing a pattern to form the flow path.

14 Claims, 6 Drawing Sheets

LIQUID DISCHARGING HEAD, PRODUCING METHOD THEREOF, STRUCTURE, AND PRODUCING METHOD THEREOF

BACKGROUND OF THE INVENTION

1. Field of the Invention

The present invention relates to a liquid discharging head discharging a liquid and a producing method thereof as an aspect of the invention. To put it concretely, the present invention relates to an ink jet recording head performing recording by discharging an ink onto a recording medium and a producing method of the head.

Moreover, the present invention also relates to a minute structure and a producing method thereof as another aspect.

2. Description of the Related Art

As an example of using a liquid discharging head discharging a liquid, an ink jet recording system performing recording by discharging an ink to a recording medium can be cited.

An ink jet recording head to be applied to the ink jet recording system (liquid jet recording system) is generally equipped with a plurality of minute discharge ports, liquid flow paths, and energy generating devices provided at parts of the liquid flow paths to generate energy to be used for discharging a liquid. Conventionally, as a producing method of such an ink jet recording head, for example, U.S. Pat. No. 5,478,606 has disclosed the following.

First, a pattern of an ink flow path is formed on a substrate on which energy generating devices are formed by means of a resoluble resin. Next, a coating resin layer including an epoxy resin and a cationic photoinitiator is formed on the ink flow path pattern as an ink flow path wall, and discharge ports are formed on the energy generating devices by photolithography. The resoluble resin is finally eluted, and the coating resin layer to become the ink flow path wall is cured.

Now, it is necessary to consider the following at the time of the exposure of forming the pattern of the ink flow path and the discharge ports by the photolithography.

If a light is radiated from the discharge side, then the intensity of the lights radiated from the discharge ports to the substrate is attenuated because the member to be formed as the ink flow path walls absorbs light. Accordingly, in order to secure the joining property of the substrate with the ink flow path walls, it is necessary to radiate the light from the so-called discharge port surface situated in the vicinity of the substrate surface to a deeper position. Hereby, the member (epoxy resin or the like) to be formed as the ink flow path walls can sufficiently be cured at the deeper position mentioned above, and the ink resistance property thereof and the joining property thereof to the substrate can be obtained. On the other hand, it is necessary to consider the following in the case of radiating the light having the intensity of the degree of reaching from the discharge ports to the substrate surface in that manner to the member to be formed as the ink flow path walls. That is, if the light to be radiated has experienced the above-mentioned attenuation, then, even if the light is the one having an appropriate intensity in the vicinity of the substrate surface, the light sometimes is the one having an excessive intensity in the vicinity of the discharge ports where the light has not experienced any attenuation. If the light having the excessive intensity is radiated, then the light sometimes becomes an obstacle of obtaining the desired discharge ports with good accuracy. That is, there are apprehensions of the occurrences of the bad patterns of the discharge ports and the damage of the ink flow path pattern in the case of the producing method using the ink flow path mentioned above by the excessive exposure. If the failures mentioned above have occurred, the failures sometimes cause the dispersion of the directions and the sizes of discharged droplets, and the influences to the images are apprehended. Moreover, the discharge droplets of an ink jet recording head have recently tended to be miniaturized. Consequently, the dispersion of the directions and the sizes of the discharge droplets are more remarkable.

SUMMARY OF THE INVENTION

The present invention aims to provide an ink jet recording head capable of lessening the attachments to the discharge port surfaces thereof and puddles such as ink mists to enable to obtain fine discharges without producing slippages even in the case of discharging minute ink drops.

According to the present invention, the attachments to the discharge port surfaces are decreased, and the puddles of ink mists to the surfaces are suppressed. Moreover, because the present invention can be applied to resin materials that are generally used for the flow path forming member of an ink jet recording head, the selectivity of materials is not limited in the scope of the invention.

Further features of the present invention will become apparent from the following description of exemplary embodiments with reference to the attached drawings.

DESCRIPTION OF THE EMBODIMENTS

Figure 1:
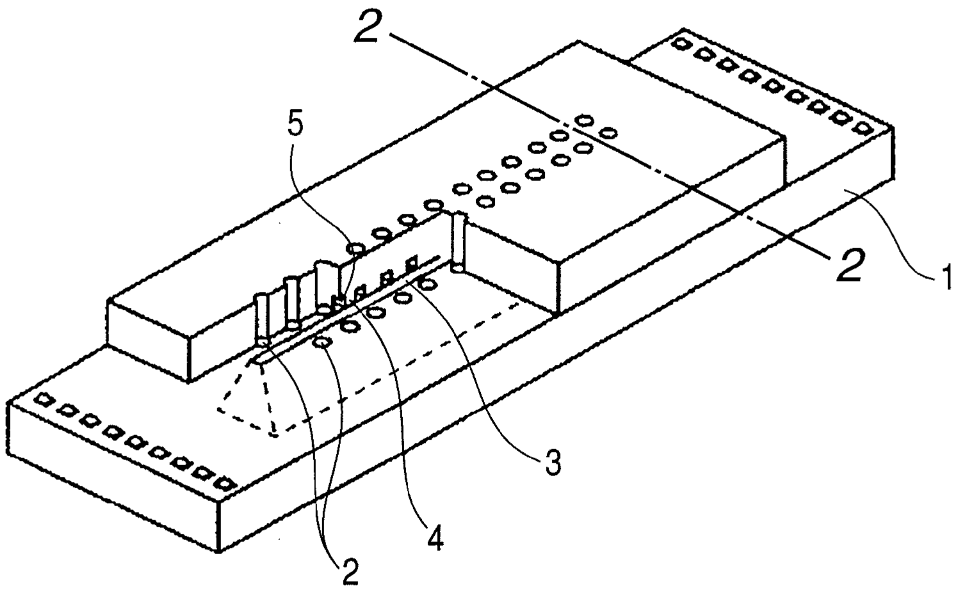
FIG. 1 is a perspective view illustrating an example of an ink jet recording head according to an exemplary embodiment of the present invention.

In the following, the present invention will concretely be described with reference to the attached drawings. In the following description, the configurations including the same functions are denoted by the same reference numerals in the drawings, and their descriptions are sometimes omitted.

Incidentally, a liquid discharging head can be installed in a printer, a copier, a facsimile apparatus including a communication system, an apparatus such as a word processor including a printer section, and an industrial recording apparatus compositively combined with various processing apparatus.

Then, by using the liquid discharging head, it is possible to perform recording on various recording media such as paper, threads, fibers, cloths, leathers, metals, plastics, glass plates, woods, and ceramics. Incidentally, the term “recording” in the present specification indicates not only forming significant images such as characters and figures on a recording medium, but also forming insignificant images such as patterns on the recording medium.

Furthermore, the words “ink” and “liquid” should be broadly interpreted, and it is supposed that the words “ink” and “liquid” mean liquids that are supplied to form an image, a design, a pattern, and the like, to work a recording medium, or to process ink or a recording medium, by being provided on the recording medium. The processing of the ink or the recording medium here means, for example, the improvement of the fixing property by the solidification or the insolubilization of a color material in the ink provided on the recording medium, the improvement of a recording quality or a chromogenic property, and the improvement of image durability here.

FIG. 1 is a schematic view illustrating a liquid discharging head according to an exemplary embodiment of the present invention.

The liquid discharging head of the present exemplary embodiment includes a Si substrate 1, on which energy generating devices 2 generating energy used for discharging a liquid are formed to be arranged in two rows at predetermined pitches. A supply port 3, formed by performing the anisotropic etching of Si, is opened in the substrate 1 between two rows of the energy generating devices 2. Discharge ports 5 formed at positions opposed to the respective energy generating devices 2 and individual flow paths communicating with the respective discharge ports 5 from the supply port 3 are formed on the substrate 1 with a flow path forming member 4. Incidentally, the positions of the discharge ports 5 are not limited to those opposed to the positions of the energy generating devices 2.

When the liquid discharging head is used as an ink jet recording head, the surface on which the discharge ports 5 are formed is disposed so as to face the recording surface of a recording medium. Then, the energy generated by the energy generating devices 2 is used by the ink filled in a flow path through the supply port 3, and ink droplets are discharged from the discharge ports 5. By adhering the ink droplets to the recording medium, recording is performed. As the energy generating devices 2, there are an electrothermal conversion element (the so-called heater) generating thermal energy and a piezoelectric element generating mechanical energy, but the energy generating devices 2 are not limited to these elements.

Figure 2:
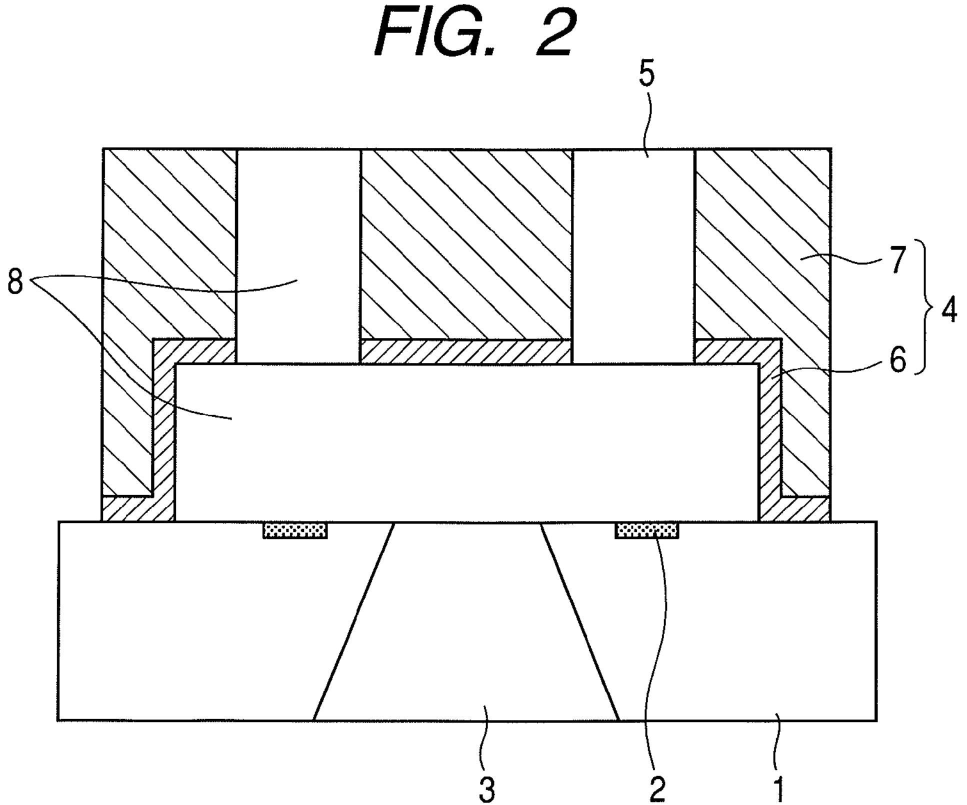
FIG. 2 is a schematic sectional view illustrating an example of the ink jet recording head according to the exemplary embodiment of the present invention.

FIG. 2 is a schematic sectional view illustrating the example of the liquid discharging head according to the exemplary embodiment of the present invention when the liquid discharging head is viewed at a cross-section perpendicular to the substrate 1 on a line 2-2 in FIG. 1.

As illustrated in FIG. 2, the flow path forming member 4 forming a flow path 8 communicating with the supply port 3 and the discharge ports 5 is made of a photosensitive resin capable of being patterned with light, and especially the flow path forming member 4 can be made of a negative type photosensitive resin, which is formed by the curing of parts irradiated by the light. The principal components of the negative type photosensitive resin are the resin of the base thereof, which is the principal component, and a photo-initiated polymerization initiator. When a light is radiated onto the negative type photosensitive resin, the photo-initiated polymerization initiator, which has absorbed the irradiated light, shows an operation of starting the curing of the resin of the base. The selection of the combination of the resin of the base and the photo-initiated polymerization initiator is arbitrary. If an example of the selection is cited, a photo-acid-generating agent is used as the photo-initiated polymerization initiator if the resin of the base is cationically polymerizable, and an acid produced by light irradiation causes a starting reaction of cationic polymerization. The other examples will be described later. Moreover, it was described that the photo-initiated polymerization initiator that had absorbed radiated light showed an operation of starting the curing of the resin of the base. The operation includes the creation and the separation of a catalytic material acting at an advantage of a specific polymerization reaction in addition to the creation and the separation of an active species at the initiation stage of a curing reaction (polymerization reaction).

Figure 6:
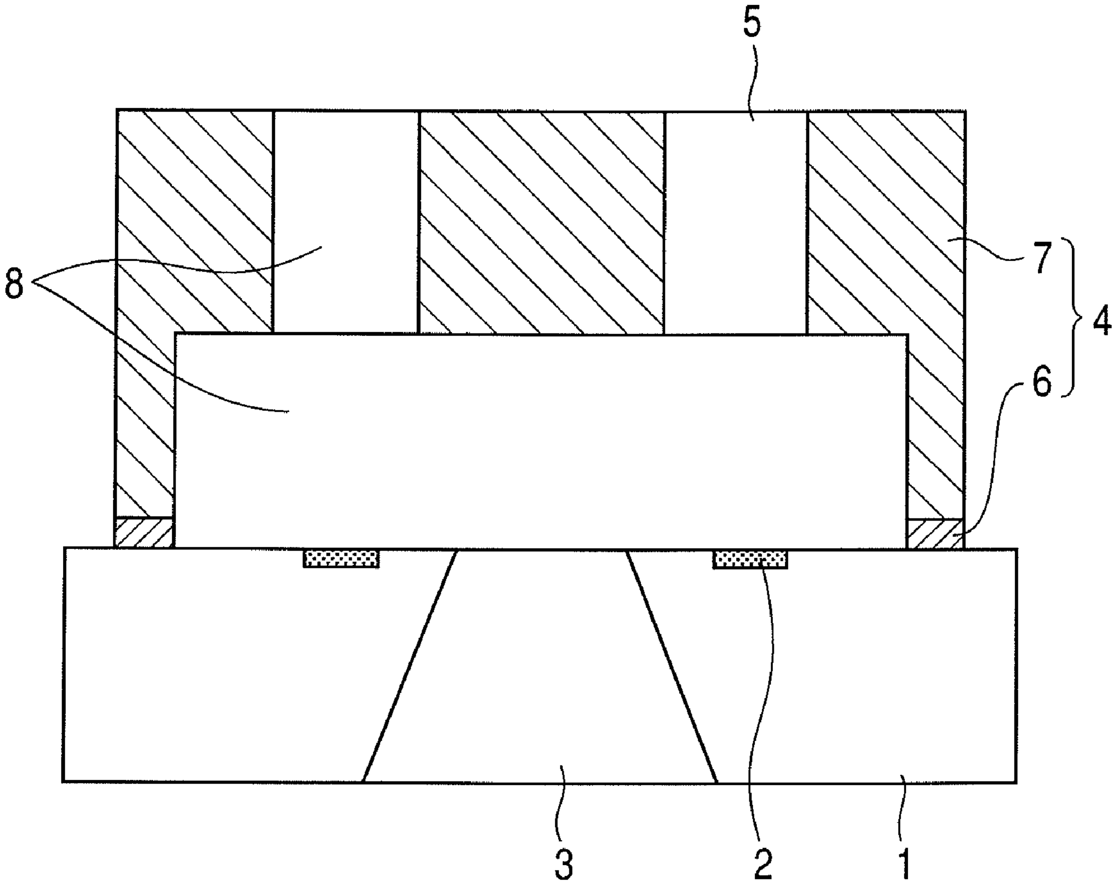
FIG. 6 is a schematic sectional view illustrating an example of an ink jet recording head according to an exemplary embodiment of the present invention.

The flow path forming member 4 includes a sensitizing agent of the photo-initiated polymerization initiator. As illustrated in FIG. 2, at least the position of a region 6 in the vicinity of the interface on the side of the substrate 1 in the flow path forming member 4 is the region in which the density of the sensitizing agent is higher in comparison with that on the side of the discharge ports 5. The region 6 exists in the vicinity of the interface with the substrate 1 in the flow path forming member 4, and may not exist in the top surface part of the flow path 8 sometimes as illustrated in FIG. 6. The density means the weight of the sensitizing agent included in a part to that of the member constituting the part. The sensitizing agent is not always continuously included in the flow path forming member 4 from the discharge ports 5 to the substrate 1, but the sensitizing agent is sometimes intensively high in density in the region 6. Moreover, there is a case where the sensitizing agent is also included in a part 7 and the density of the sensitizing agent gradually becomes higher from the discharge ports 5 to the region 6 as another aspect.

The part 7 is used for distinguishing the region 6 in the flow path forming member 4. The boundary between the region 6 and the part 7 in the flow path forming member 4 is clear to the degree capable of being distinguished by layers in a certain case, and is not so clear in another case.

If both of the region 6 and the part 7 are formed in the layers, the region 6 can be called as a first layer, and the part 7 can be called as a second layer. There is a case where the first layer and the second layer are integrated with each other by the cross-linking of the mutual base resin constituting the negative type photosensitive resin and the region including the light sensitizing agent is formed on the side of the substrate 1. In this case, there is a region where the density of the sensitizing agent is higher at a position near the side of the substrate 1 in comparison with the side near the discharge ports 5 in the flow path forming member 4. In this case, for example, the member constituting the opening surface of the discharge ports 5 on the side of the discharge ports 5 is in the region where the density of the sensitizing agent is less than that in the region in the vicinity of the substrate 1 or where no light sensitizing agents are detected. Moreover, it is also possible to further provide a third layer (not illustrated) made of a negative type photosensitive resin on the second layer as another exemplary embodiment of the present invention. In this case, the density of the sensitizing agent in the third layer can be made to be smaller than that in the second layer.

The sensitization operation of the sensitizing agent will be described later.

As the resins to be generally used as the resin of the base applicable to the flow path forming member 4, a cationically polymerizable resin, an anionically polymerizable resin, a radically polymerizable resin, and the like, can be cited.

As the cationically polymerizable resin, an epoxy resin, a vinyl ether resin, an oxetane resin, and the like, can be cited.

Furthermore, as concrete examples of the epoxy resin, an alicyclic epoxy resin, a bisphenol epoxy resin, a novolac epoxy resin, a glycidylester epoxy resin, and the like, can be cited. Moreover, the epoxy resins having the structures expressed by the following chemical formulae (1) and (2) also can be used.

As to the photo-initiated polymerization initiator, the photo-acid-generating agent is used as the cationic photoinitiator to the cationically polymerizable resin. To put it concretely, the photo-acid-generating agent includes a iodonium salt, a sulfonium salt, a triazine halide compound, and the like.

Chemical formula (1)

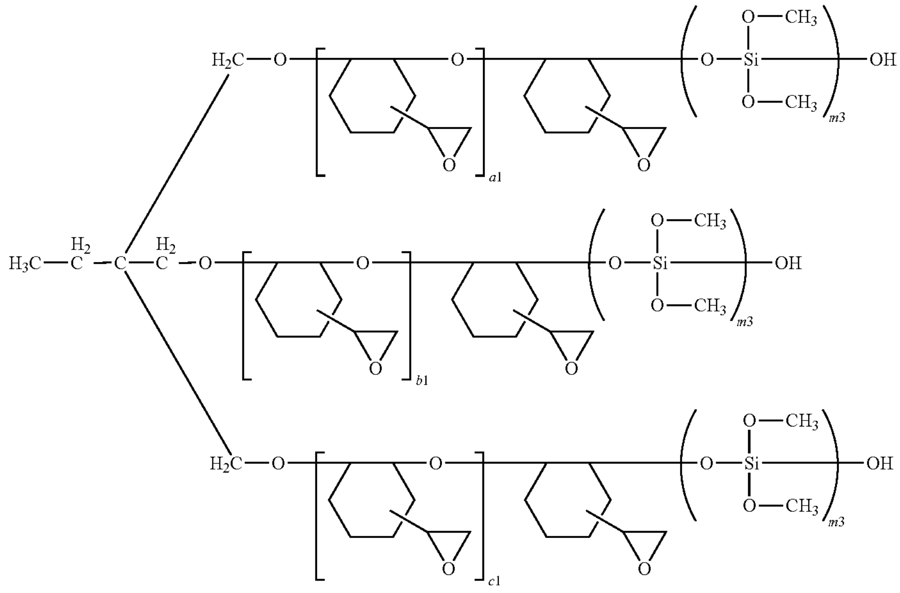

Signs a1, b1, and c1 each denote a natural number, and a sign m3 denotes a natural number.

Chemical Formula (2)

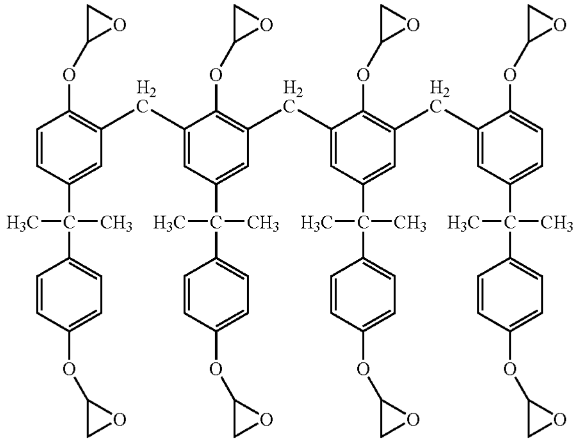

Epoxy Resin (III)

As the anionic polymerizable resins, an acrylonitrile resin, a methacrylic acid methyl resin, a styrene resin, a butadiene resin, and the like, can be cited.

As the radically polymerizable resins, a urethane acrylate resin, an epoxy acrylate resin, an ester acrylate resin can be cited.

Moreover, as a polymerization initiator corresponding to the anionic polymerizable resin, a photobase generator can be cited. To put it concretely, a lithium alkyl compound is famous.

Moreover, similarly, as a photoradical generator, aromatic ketone series, such as benzophenone and Michler's ketone [4,4'-bis(dimethylamino)benzophenone], and benzoin ether series are famous.

As commercially available cationic photoinitiators, SP-172 and SP-170 launched by Adeka Corporation can be cited. Moreover, WPAG-142 and WPAG-170 launched by Wako Pure Chemical Industries, Ltd., and Irgaure 261 launched by Ciba Specialty Chemicals Inc. can be cited.

Moreover, as another example of the negative type photosensitive resin that can be used by the present invention, a resin having a polyether amide skeleton, which includes a photo-acid-generating agent and a functional group causing a polymerization reaction under an acid condition can be cited.

The sensitizing agent (also called as a light sensitizing agent) of the photo-initiated polymerization initiator used for the present invention is a material expressing the operation of absorbing light and moving the energy caused by the absorption of the light to the photo-initiated polymerization initiator. For example, the sensitizing agent of the cationic photoinitiator can absorb the light having the wavelength that the cationic photoinitiator does not strongly absorb the light, and can move the energy to the cationic photoinitiator. The energy received by the cationic photoinitiator by the movement supports the cationic photoinitiator when the cationic photoinitiator generates cations. The principle and the mechanism of the energy movement of the sensitization operation by the light sensitizing agent are explained in various scientific documents.

As the light sensitizing agent, a heterocyclic ring including light sensitizing agent and an amino-benzophenone light sensitizing agent are principal ones. As the sensitizing agent absorbing the light of 365 nm, an anthracene derivative light sensitizing agent is useful.

As a commercially available light sensitizing agent, for example, SP 100 launched from Adeca Corporation exists.

Figure 4:
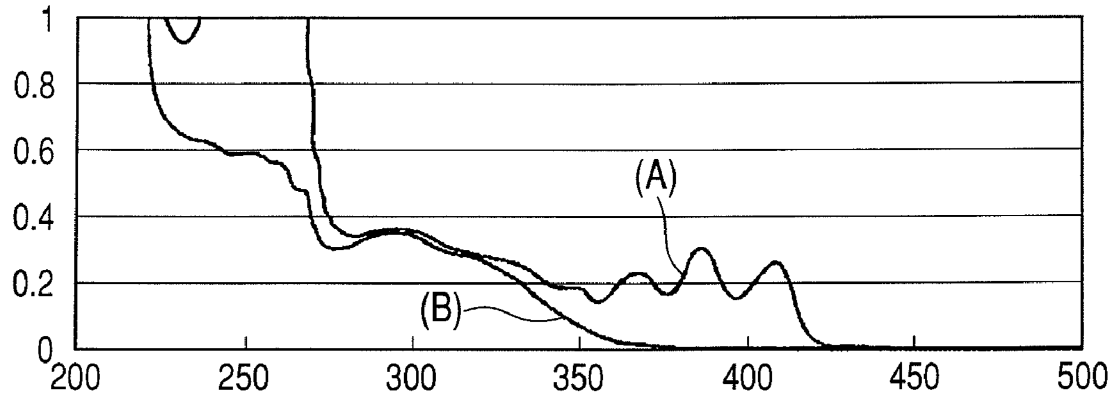
FIG. 4 is a diagram illustrating light absorption spectra of the material for flow path forming member that can be applied to the present invention.
Figure 5:
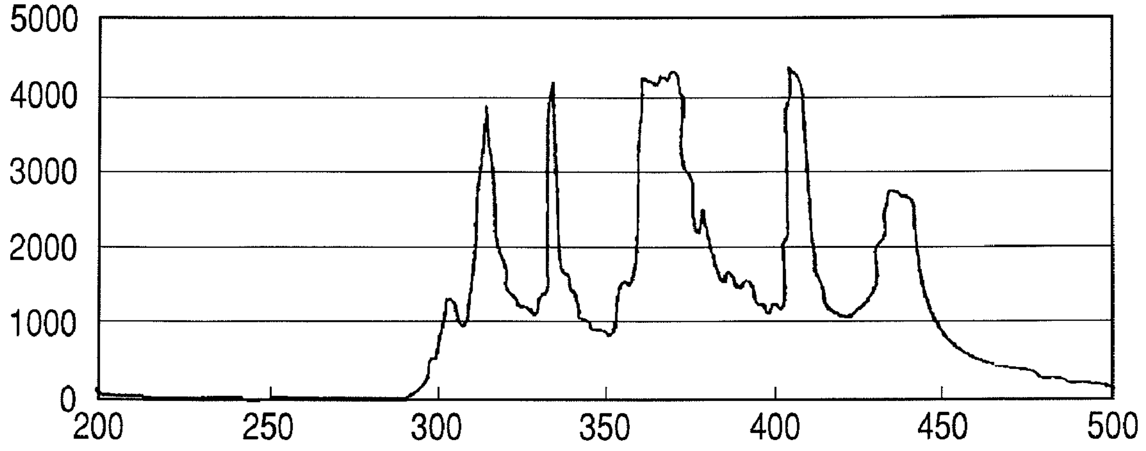
FIG. 5 is a diagram illustrating irradiation spectrum of a mercury lamp that can be applied to the present invention.

The effects attained by the sensitizing agent in the present invention are described by referring to an example here. FIG. 4 illustrates light absorption spectra of a (A) material for an ink flow path forming member (including an epoxy resin, a cationic photoinitiator, a light sensitizing agent (anthracene derivative), and a solvent) that can be applied to the present invention, and a (B) material obtained by removing the sensitizing agent from the material (A). The ordinate axis of the graph indicates relative absorbance (arbitrary unit), and the abscissa axis of the graph indicates wavelengths (nm). Moreover, FIG. 5 illustrates a graph illustrating the irradiation spectrum of an exposing machine (using a light source of a high pressure mercury lamp), which can be used for the exposure of the material for a flow path forming member illustrated in FIG. 2. The ordinate axis of the graph indicates relative absorbance (arbitrary unit), and the abscissa axis of the graph indicates wavelengths (nm).

As illustrated in FIG. 4, in the case of the ink flow path forming member without adding any light sensitizing agent, it is known that almost all the lights having the wavelengths of 360 nm or longer transmit the ink flow path forming member, and that the lights having the wavelengths of 360 nm or shorter hardly contribute to the curing. Consequently, if the exposing machine described with reference to FIG. 3 is used to the exposure of a flow path forming member having a thick film thickness, it is necessary to increase the light exposure in order to perform the curing to a deep part (to the vicinity of the substrate 1) securely. However, because a shallow part (in the vicinity of the discharge ports 5) is adversely excessively exposed in this case, there is the possibility of causing the aggravation of the shapes of the discharge ports 5. Next, if the light sensitizing agent is added to the ink flow path forming member, because the lights having the wavelengths of 420 nm or shorter contribute to the curing effectively as illustrated in FIG. 4, it can be expected to be able to perform the exposure by a small light exposure.

The negative type photosensitive resin mentioned above is made to be a solution with a suitable solvent, and is formed to a film by the spin coat method to form a layer, or is formed to a film to be laminated to form a layer.

The density of the sensitizing agent (the weight percentage of the light sensitizing agent to the negative type photosensitive resin component (except for the solvent)) in the region 6 (lower layer) in the flow path forming member 4 is higher than that of the sensitizing agent in the vicinity of the discharge ports 5. This situation is valid in the case where only the first layer includes the sensitizing agent, and in the case where both of the first and the second layers include the sensitizing agents. Hereby, the curing reaction after light irradiation securely progresses, and the flow path forming member 4 becomes the one having strong bonding strength with the substrate 1. Moreover, in the form illustrated in FIG. 2, because the region 6 directly touching to the ink has high hardness and a high ink resistance property, the reliability of the whole flow path forming member becomes very high.

Next, an example of the producing method of a liquid discharging head of the present invention will be described with reference to FIGS. 3A-3G.

FIGS. 3A to 3G are schematic sectional views illustrating an example of the process the producing method of the liquid discharging head of the present invention.

Figure 3A:
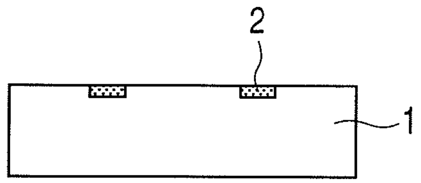
FIGS. 3A, 3B, 3C, 3D, 3E, 3F and 3G are schematic sectional views illustrating an example of a producing method of an ink jet recording head according to an exemplary embodiment of the present invention.

First, as illustrated in FIG. 3A, the substrate 1 provided with the energy generating devices 2 is prepared.

Figure 3B:
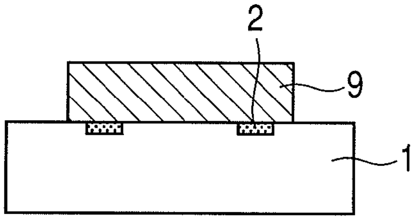

Next, as illustrated in FIG. 3B, a pattern 9 of a flow path is formed on the substrate 1. As the material to form the pattern 9, a resoluble resin can be used, and more concretely a positive photosensitive resin and the like can be cited. The positive photosensitive resin is laminated on the substrate 1 to be formed by means of the technique of the photolithography.

Figure 3C:
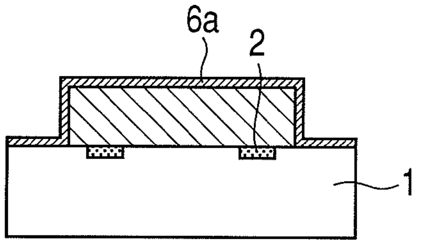

Next, as illustrated in FIG. 3C, a first layer 6*a* (before curing) is formed so as to coat the pattern 9. The first layer 6*a* touches with the substrate 1 at the parts other than the upper part of the pattern 9 at this time. Moreover, an adhesion layer (made of a thermoplastic resin or the like) for enhancing the adhesion force between the substrate 1 and the first layer 6*a* sometimes exists between the first layer 6*a* and the substrate 1. The first layer 6*a* is made of a negative type photosensitive resin. The negative type photosensitive resin forming the first layer 6*a* includes a resin of a base, a photo-initiated polymerization initiator, and a sensitizing agent of the photo-initiated polymerization initiator.

Figure 3D:
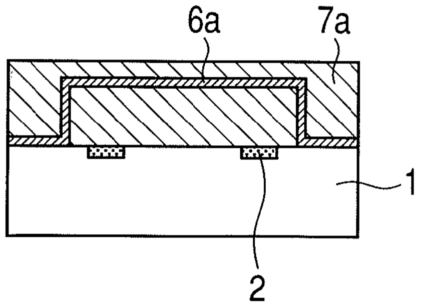

Next, as illustrated in FIG. 3D, a second layer 7*a* is formed on the first layer 6*a*. The second layer 7*a* (before curing) is formed of a resin of a base, and a negative type photosensitive resin including a photo-initiated polymerization initiator similarly to the first layer 6*a*. In this case, the base resin and the photo-initiated polymerization initiator in the second layer 7*a* can be the same ones in the first layer 6*a*, respectively, from the point of view of the affinity of both the layers. Moreover, the second layer 7*a* may include a sensitizing agent.

At this time, the density of the light sensitizing agent (the weight percentage of the light sensitizing agent to the resin component) included in the first layer 6*a* is higher than that of the light sensitizing agent included in the second layer 7*a*. At this time, the densities of the first layer 6*a* and the second layer 7*a* satisfy the conditions mentioned above, and the densities can arbitrarily be selected within a range in which exposure can be performed. Moreover, the thickness of the first layer 6*a* can be formed to be thinner than that of the second layer. The thickness of the first layer (film thickness) can especially be formed to be within a range from 2.5% to 50%, both inclusive, to the thickness of the sum of the first layer and the second layer. The range is set in view of the appropriateness of the absorption of light of the first layer itself and the sufficient reaching of the light to the vicinity of the joining part with the substrate 1 (lower part). The activity of the polymerization initiator in the negative type photosensitive resin is deeply related to the acceleration of polymerization. By such a setting, the bonding strength of the whole flow path forming member on the substrate interface is improved in a later exposure process. Moreover, the ink resistance property as the flow path is improved by the improvement of the degree of the curing at the same time.

Figure 3E:
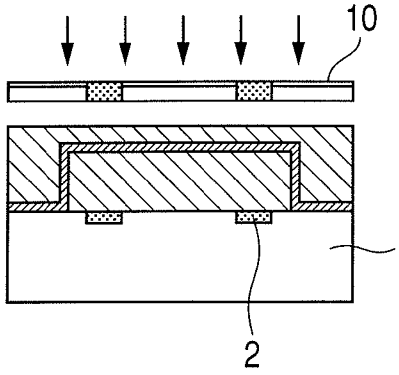

Next, as illustrated in FIG. 3E, the first and the second layers 6*a* and 7*a* are exposed by using a discharge port forming mask 10. The present invention also has an advantage of being capable of the changes of the degrees of curing of the second layer 7*a* (upper layer) and the first layer 6*a* (lower layer) by an exposure in a lump.

Figure 3F:
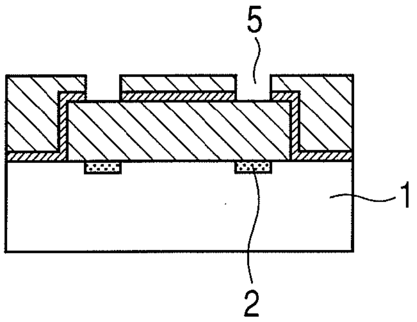

Next, as illustrated in FIG. 3F, the development processing of the second layer 7*a* (upper layer) and the first layer 6*a* (lower layer) is performed to form the discharge ports 5.

Figure 3G:
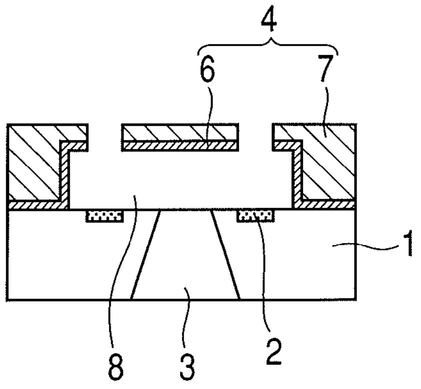

Next, as illustrated in FIG. 3G, the supply port 3 is formed, and then the pattern 9 is removed to form the flow path 8.

By the manner described above, the liquid discharging head illustrated in FIG. 2 is completed.

After that, necessary electric connections and the like are also performed (not illustrated).

Successively, another example of the producing method as another exemplary embodiment of the present invention will be described.

Figure 7A:
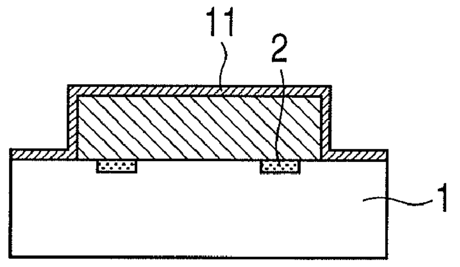
FIGS. 7A, 7B, 7C, 7D and 7E are schematic sectional views illustrating an example of a producing method of the ink jet recording head according to an exemplary embodiment of the present invention.

After performing the processes illustrated in FIGS. 3A and 3B, surface processing is performed on the substrate 1. The surface processing is performed by means of a solution including a light sensitizing agent having a sensitizing effect to a photo cationic polymerization catalyst and a silane coupling agent having an epoxy group. The same light sensitizing agent as that described above can be used. As the silane coupling agent, no special limitations to the silane coupling agent exist as long as the silane coupling agent includes the epoxy group. As the examples of such a silane coupling agent, γ-glycidoxypropyltrimethoxysilane and 2-(3,4-epoxycyclohexyl)ethyltrimethoxysilane can be cited. The γ-glycidoxypropyltrimethoxysilane is commercially available as, for example, a trade name "A-187" from Nippon Unicar Company Limited. The compounding ratio of the light sensitizing agent and the silane coupling agent can be within a range from 1/100 to 1/8 , both inclusive, by a weight ratio. If the weight ratio is 1/100 or more, then a desired sensitization operation can more securely be obtained. Moreover, if the weight ratio is larger than 1/8, then there is a possibility that the sensitization operation crystallizes to adhere to the substrate surface after the agent solution has been processed. The weight ratio can more specifically be within a range from 1/50 to 1/10, both inclusive. By the surface processing mentioned above, the state illustrated in FIG. 7A is obtained. A processing solution 11 is applied. The processing solution 11 is very thin at this time.

Figure 7B:
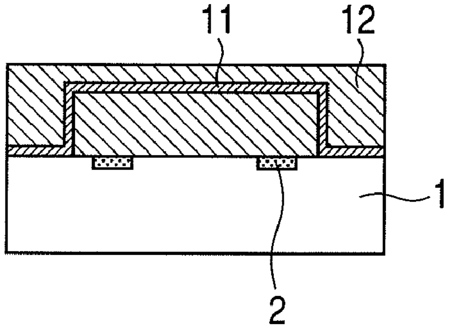

Next, as illustrated in FIG. 7B, a negative type photosensitive resin 12, which becomes a flow path forming member, is formed. In this sate, the processing solution 11 touches with the negative type photosensitive resin 12. In the negative type photosensitive resin 12, a region in which the density of the sensitizing agent is higher is produced at an interface part with the substrate 1 by surface processing.

Figure 7C:
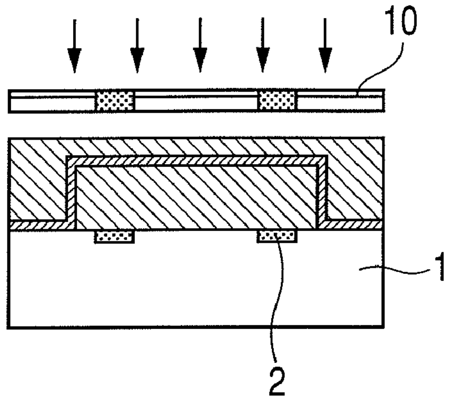

Next, as illustrated in FIG. 7C, the negative type photosensitive resin 12 is exposed with the discharge port forming mask 10.

Figure 7D:
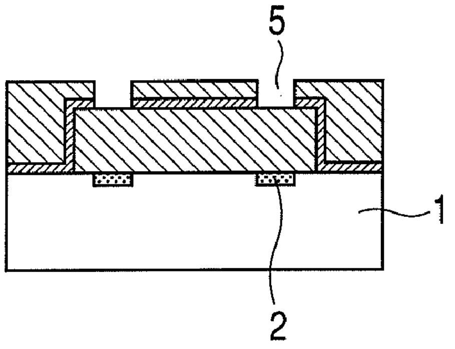

Next, as illustrated in FIG. 7D, the discharge ports 5 are formed.

Figure 7E:
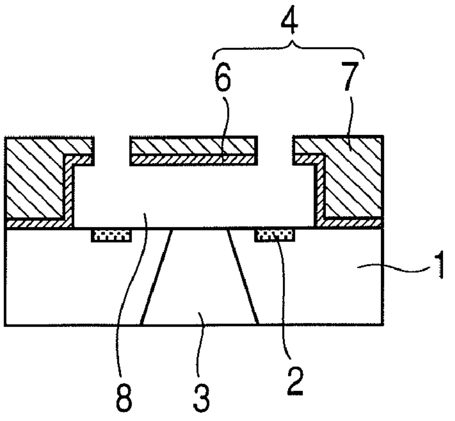
Figure 8A:
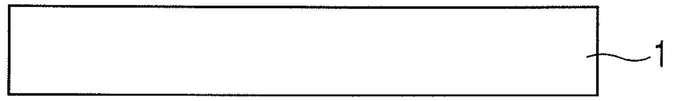
FIGS. 8A, 8B, 8C, 8D and 8E are schematic sectional views illustrating an example of a forming method of a structure according to an exemplary embodiment of the present invention.
Figure 8B:
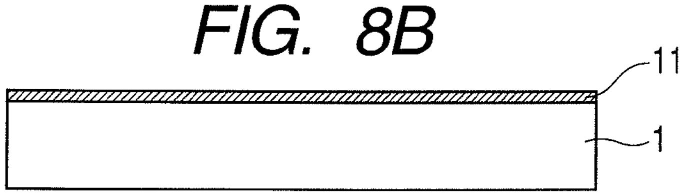
Figure 8C:
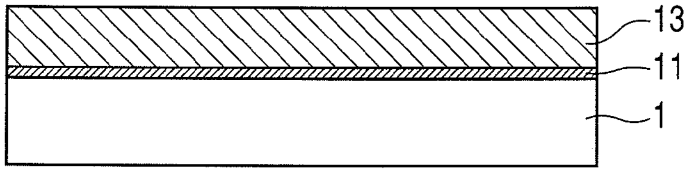
Figure 8D:
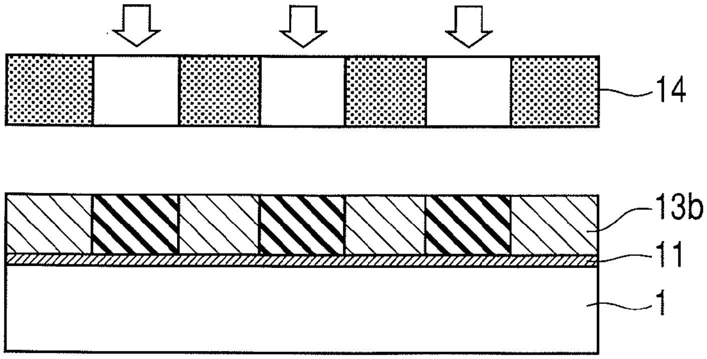
Figure 8E:
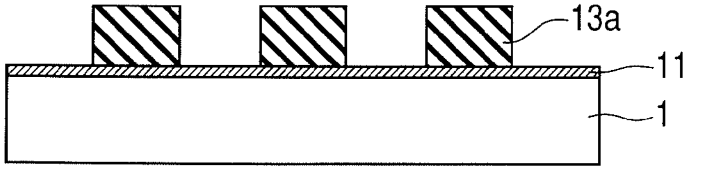

Next, as illustrated in FIG. 7E, the patter of the flow path is removed to form the flow path 8.

In the following, examples will be illustrated, and thereby the present invention will furthermore minutely be described.

EXAMPLES

A liquid discharging head was produced as follows similarly to the method described with reference to FIGS. 3A to 3G.

First, acrylic resin positive resist ODUR 1010A (made by Tokyo Ohka Kogyo Co., Ltd.) was applied on the substrate 1 made of silicon, and the resist was patterned by means of the photolithography technique to form the pattern 9 (FIG. 3B).

Next, as the first and the second materials for forming the flow path forming member, solutions produced by dissolving the epoxy resins, the photo-initiated polymerization initiators, and the sensitizing agents that were described below in suitable solvents were prepared. The solvent coating of the first layer 6*a* was performed on the substrate 1, on which the pattern 9 was formed, by using the materials, and the second layer 7*a* was formed as a film on the first layer 6*a* by the solvent coating (FIGS. 3C and 3D).

First layer: epoxy resin (EHPE 3150 made by Daicel Chemical Industries, Ltd.) [100 parts by weight]

Photo-acid-generating agent (SP-172 made by Adeca corporation) [6 parts by weight]

Light sensitizing agent: anthracene series derivative (SP-100 made by Adeca corporation) [2 parts by weight]

Second layer: epoxy resin (EHPE 3150 made by Daicel Chemical Industries, Ltd.) [100 parts by weight]

Photo-acid-generating agent (SP-172 made by Adeca corporation) [6 parts by weight]

At this time, the thicknesses of the first and the second layers 6*a* and 7*a* were made to be different from each other according to each example. Incidentally, the thicknesses (μm) were those after drying the application solvents after the solvent coating, and the film thicknesses after curing became almost the same thicknesses.

Next, the first and the second layers 6*a* and 7*a* were exposed in a lump by an exposing machine using a high pressure mercury lamp (described with reference to FIG. 5) as a light source (under the conditions illustrated in a Table 1), and were developed to form the discharge ports 5 (each having a diameter of 8 μm) (FIG. 3F).

Next, the substrate 1 was subjected to anisotropic etching, and the supply port 3 was formed. Next, the pattern 9 was removed, and furthermore the substrate 1 was heated at 200° C. for one hour in order to cure the epoxy resin completely. Thus the liquid discharging head was obtained.

The Table 1 illustrates the thicknesses of the first and the second layers 6*a* and 7*a* (film thicknesses), the light exposures to both the layers 6*a* and 7*a*, and evaluation results to each example, and the evaluation results of comparative examples. As the comparative examples, one in which the flow path forming member was formed of only the first layer and one in which the flow path forming member was formed of only the second layer were prepared.

(Adhesion Property)

The adhesion property between the flow path forming member 4 and the substrate 1 was evaluated.

A: good adhesion property

B: there were little parts where the adhesion property was bad, and the degrees offered no problem C: there were parts where the adhesion property was bad (Shapes of Discharge Ports)

The shapes of the discharge ports of completed liquid discharging heads were evaluated.

A: good discharge port shapes

B: there were little parts where the shapes of the discharge ports were bad, and the degrees offered no problem C: there were parts where the shapes of the discharge ports were bad (Evaluations of Images)

Moreover, the produced liquid discharging heads were mounted on apparatus, and 50000 sheets of paper were printed as tests by using an ink composed of ethylene glycol/urea/isopropyl alcohol/black dye/water=5/3/2/3/87.

A: good images

B: there were little parts where the images were disturbed, and the degrees offered no problem C: there were parts where the images were disturbed

TABLE 1

| | Thickness of First Layer (μm) | Thickness of Second Layer (μm) | Light Exposure ($mJ/cm^2$) | Adhesion Property | Shape of Discharge Port | Image |
|---|---|---|---|---|---|---|
| First Example | 0.5 | 19.5 | 100 | A | A | A |
| | | | 120 | A | A | A |
| | | | 200 | A | B | B |
| Second Example | 1 | 19 | 100 | A | A | A |
| | | | 120 | A | A | A |
| | | | 200 | A | B | B |
| Third Example | 3 | 17 | 100 | A | A | A |
| | | | 120 | A | A | A |
| | | | 200 | A | B | B |
| Fourth Example | 5 | 15 | 100 | A | A | A |
| | | | 120 | A | A | A |
| | | | 200 | A | B | B |
| Fifth Example | 10 | 10 | 100 | A | A | A |
| | | | 120 | A | A | A |
| | | | 200 | A | B | B |
| Sixth Example | 15 | 5 | 100 | A | A | A |
| | | | 120 | A | B | B |
| | | | 200 | A | B | B |
| Comparative Example | 20 | Not Formed | 100 | A | C | C |
| | | | 120 | A | C | C |
| | | | 200 | A | C | C |
| Referential Example | Not Formed | 20 | 100 | B | A | A |
| | | | 120 | A | A | A |
| | | | 200 | A | B | B |

As illustrated in the results, good results were obtained as to the adhesion properties with the substrates 1 and the shapes of the discharge ports 5 were also good by forming the first layers 6*a*. In particular, if the thicknesses of the first layers 6*a* (film thicknesses) were within a range from 2.5% to 50%, both inclusive, to the thicknesses of the sums of the first layers 6*a* and the second layers 7*a* as in the second to fourth examples, then both the adhesion properties with the substrates 1 and the good shapes of the discharge ports 5 could be coped with even if the lights of high exposure energy are irradiated.

Moreover, the forming method of a minute structure as another aspect of the present invention will be described by illustrating the following examples.

Seventh to Ninth Examples

In each example, a minute structure, which was a cured material of a light curing resin layer having a predetermined pattern, was produced on a base material subjected to surface processing, and the adhesion property of the light curing resin layer was evaluated.

First, a Si wafer of 6 inch thick was prepared as the base material. Next, a solution having a composition illustrated in a Table 2 according to each example was coated on the Si wafer, and heating treatment was performed to the wafer to dry the coating liquid.

After that, as a negative resist, a composition including 100 weight percent of epoxy resin EHPE 3150 (trade name; made by Daicel Chemical Industries, Ltd.) and 6 weight percent of photo cationic polymerization catalyst SP-172 (trade name; made by Adeka Corporation) was applied to be 20 μm in film thickness. Then, by exposing the wafer by the light exposure illustrated in the Table 1 with mask aligner MPA 600 (trade name; made by Canon Inc.), and the waver was developed. Thus line and space (L & S) pattern of 5 μm in width was formed on a rectangular parallelepiped as a structure.

In the formed structure, the density of the sensitizing agent in the vicinity of the interface with the substrate was higher, and the surface of the structure distant from the substrate did not include any sensitizing agent.

The light curing resin layers of the produced patterns were observed. The pattern obtained in a seventh example, in which the light sensitizing agent was added to the solution, did not show any exfoliation of the light curing resin layer. Furthermore, also in second and third examples, in which the light exposures were lessened, the light curing resin layers was not peeled. On the other hand, in a second comparative example 2, the light curing resin layers may be peeled.

As described above, it was found that the adhesion property between the light curing resin layer and the base material of the laminated body of the present invention was sufficient.

TABLE 2

| | Composition of Processing Solution | | | | |
|---|---|---|---|---|---|
| | Silane Coupling Agent A-187 (Nippon Unicar Co., Ltd) | Light Sensitizing agent SP-100 (Adeka Corp.) | Solvent (Xylene) | Light Exposure | Adhesion Property |
| Seventh Example | 10 parts | 1 part | 100 parts | 200 $mJ/cm^2$ | B |
| Eighth Example | 10 parts | 1 part | 100 parts | 160 $mJ/cm^2$ | B |
| Ninth Example | 10 parts | 1 part | 100 parts | 120 $mJ/cm^2$ | B |
| Second Comparative Example | 10 parts | 1 part | 100 parts | 200 $mJ/cm^2$ | C |

Tenth Example 125 parts of EHPE 3150 (trade name; made by Daicel Chemical Industries, Ltd.) was added to the processing solution of the seventh example. A pattern was formed under the same conditions as those of ninth example except for the addition of the processing solution. Similarly to the seventh example, a pattern having sufficient adhesion property with the substrate was obtained.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application Nos. 2007-160194 filed Jun. 18, 2007, and 2007-162487 filed Jun. 20, 2007 which are hereby incorporated by reference herein in their entirety.

What is claimed is:

1. A producing method of a liquid discharging head including a discharge port discharging a liquid and a flow path communicating with the discharge port, the method comprising the steps of:

forming a pattern of a shape of the flow path on a substrate;

forming a layer of a negative type photosensitive resin composition including a photo-initiated polymerization initiator on the substrate so as to coat the pattern, at least a substrate-side region of the layer in a vicinity of the substrate including a sensitizing agent of the photo-initiated polymerization initiator, a density of the sensitizing agent in the layer being higher in the substrate-side region than in a surface-side region of the layer in a vicinity of a surface of the layer opposite to the substrate;

forming the discharge port by exposing the layer to pattern the layer; and removing the pattern to form the flow path.

2. The producing method according to claim 1, wherein the layer includes the sensitizing agent through the whole layer.

3. The producing method according to claim 1, wherein the step of forming the layer of the negative type photosensitive resin composition includes the steps of:

forming a first layer including the photo-initiated polymerization initiator, the sensitizing agent, and the polymerizable resin on the substrate provided with the pattern; and forming a second layer including at least the photo-initiated polymerization initiator and a photo-initiated polymerizable resin so as to coat the pattern formed on the substrate.

4. The producing method according to claim 3, wherein the second layer includes the sensitizing agent, and the density of the sensitizing agent in the first layer is higher than the density of the sensitizing agent in the second layer.

5. The producing method according to claim 4, wherein the second layer has a thickness greater than that of the first layer.

6. The producing method according to claim 1, wherein the step of forming the layer of the negative type photosensitive resin composition includes the step of:

applying a solution including the sensitizing agent and a silane coupling agent on the substrate, and then forming a layer including the photo-initiated polymerization initiator and a photo-initiated polymerizable resin so as to coat the pattern formed on the substrate.

7. The producing method according to claim 1, wherein the photo-initiated polymerization initiator is an aromatic sulfonium salt, and the sensitizing agent is anthracene or a derivative thereof.

8. The producing method according to claim 1, wherein the negative type photosensitive resin composition includes an epoxy resin.

9. A producing method of a structure, comprising the steps of:

forming a layer of a negative type photosensitive resin composition including a photo-initiated polymerization initiator on a substrate, at least a substrate-side region of the layer in a vicinity of the substrate including a sensitizing agent of the photo-initiated polymerization initiator, a density of the sensitizing agent in the layer being higher in the substrate-side region than in a surface-side region of the layer in a vicinity of a surface of the layer opposite to the substrate; and exposing the layer to pattern the layer.

10. The producing method according to claim 9, wherein the layer includes the sensitizing agent also in the surface-side region.

11. The producing method according to claim 9, wherein the step of forming the layer of the negative type photosensitive resin composition includes the steps of:

forming a first layer including the photo-initiated polymerization initiator, the sensitizing agent, and a polymerizable resin on the substrate; and forming a second layer including at least the photo-initiated polymerization initiator and a photo-initiated polymerizable resin so on the substrate.

12. The producing method according to claim 11, wherein the second layer includes the sensitizing agent, and the density of the sensitizing agent in the first layer is higher than the density of the sensitizing agent in the second layer.

13. The producing method according to claim 12, wherein the second layer has a thickness greater than that of the first layer.

14. The producing method according to claim 9, wherein the step of forming the layer of the negative type photosensitive resin composition includes the step of:

applying a solution including the sensitizing agent and a silane coupling agent on the substrate, and then forming a layer including the photo-initiated polymerization initiator and a photo-initiated polymerizable resin on the substrate.

* * * * *